(12) United States Patent
Yoo et al.

(10) Patent No.: US 12,262,477 B2
(45) Date of Patent: Mar. 25, 2025

(54) REPRINT APPARATUS FOR CIRCUIT BOARD AND REPRINT METHOD USING THE SAME

(71) Applicant: SAMSUNG ELECTRO-MECHANICS CO., LTD., Suwon-si (KR)

(72) Inventors: Do Jae Yoo, Suwon-si (KR); Yong Gil Namgung, Suwon-si (KR); Jong Hoon Shin, Suwon-si (KR); Sang Soon Choi, Suwon-si (KR); Young Chul An, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 76 days.

(21) Appl. No.: 18/111,154

(22) Filed: Feb. 17, 2023

(65) Prior Publication Data
US 2024/0074065 A1 Feb. 29, 2024

(30) Foreign Application Priority Data
Aug. 26, 2022 (KR) .................. 10-2022-0107543

(51) Int. Cl.
*H05K 3/22* (2006.01)
*B23K 1/00* (2006.01)
*B23K 1/005* (2006.01)
*B23K 1/19* (2006.01)
*B23K 101/42* (2006.01)

(52) U.S. Cl.
CPC ........... *H05K 3/225* (2013.01); *B23K 1/0016* (2013.01); *B23K 1/005* (2013.01); *B23K 1/19* (2013.01); *B23K 2101/42* (2018.08); *H05K 2203/16* (2013.01)

(58) Field of Classification Search
None
See application file for complete search history.

(56) References Cited

U.S. PATENT DOCUMENTS 6,286,202 B1 * 9/2001 Asai .................. H05K 13/0815
29/832
6,376,013 B1 * 4/2002 Rangarajan ......... H01L 21/6715
118/712

(Continued)

FOREIGN PATENT DOCUMENTS

CN 111432572 B * 9/2021
JP 2002042640 A * 2/2002

(Continued)

*Primary Examiner* — Devang R Patel
(74) *Attorney, Agent, or Firm* — Morgan, Lewis & Bockius LLP

(57) ABSTRACT

A reprint apparatus may include: a defect checking unit configured to check a defective portion in a solder resist layer of a circuit board; a material filling unit positioned above the circuit board to fill the defective portion with a filling material; and a curing unit configured to cure the material filled in the defective portion. The defect checking unit may be configured to calculate a volume of the defective portion, and the material filling unit may be configured to calculate a discharge amount of the filling material based on the calculated volume of the defective portion, and then discharge the filling material by the discharge amount.

18 Claims, 6 Drawing Sheets

(56) References Cited

U.S. PATENT DOCUMENTS

| | | | |
|---|---|---|---|
| 9,198,299 B2 * | 11/2015 | Ulmer | H05K 3/225 |
| 2012/0113181 A1 * | 5/2012 | Kwon | H05K 3/0079 |
| | | | 347/16 |
| 2013/0133574 A1 * | 5/2013 | Doyle | C23C 24/02 |
| | | | 118/712 |

FOREIGN PATENT DOCUMENTS

| | | | | |
|---|---|---|---|---|
| KR | 10-2006-0091481 A | | | 8/2006 |
| KR | 20060091481 A | * | | 8/2006 |
| KR | 20070039292 A | * | | 4/2007 |
| KR | 10-2021-0068955 A | | | 6/2021 |
| WO | WO-2021112381 A1 | * | | 6/2021 |

* cited by examiner

REPRINT APPARATUS FOR CIRCUIT BOARD AND REPRINT METHOD USING THE SAME

CROSS-REFERENCE TO RELATED APPLICATION(S)

This application claims benefit of priority to Korean Patent Application No. 10-2022-0107543 filed on Aug. 26, 2022 in the Korean Intellectual Property Office, the disclosure of which is incorporated herein by reference in its entirety.

TECHNICAL FIELD

The present disclosure relates to a reprint apparatus for a circuit board and a reprint method using the same.

BACKGROUND

In order to repeatedly manufacture complex and elaborate patterns on a circuit board in large quantities, a certain pattern is formed with solder resist (or photo solder resist), which is often used as a process mask to process a target material layer therebelow.

Photolithography refers to an operation by typically, performing an exposure process in which a photoresist, a photosensitive material, is applied to a substrate to be processed to form a photoresist layer, a photomask having a pattern formed thereon is disposed on the photoresist layer and then exposed to light so that a photochemical reaction of the portion, exposed to light in the photoresist layer according to the photomask pattern is performed, performing a developing process for removing the photochemically reacted portion or the unreacted portion by acting a developer, and performing an etching process on a target material layer therebelow using a photoresist pattern remaining through the developing process as an etching mask to eventually form a target material layer pattern according to the photomask pattern.

However, in the photolithography process, partial defects may occur in the photoresist pattern due to various factors such as the photoresist material, exposure conditions, or a shape of the exposure pattern. For example, a hole, such as a pin hole, may be formed in a portion in which a photoresist layer should exist, so that a defect in which a metal layer located below the photoresist layer is unintentionally exposed may occur.

When all defective substrates are discarded, both material costs and process costs may be lost, and thus the cost of overall product production may be increased.

SUMMARY

An aspect of the present disclosure is to provide a reprint manufacturing apparatus for a circuit board capable of repairing a defective portion of a solder resist layer and a reprint method using the same.

According to an aspect of the present disclosure, a reprint apparatus, may include: a defect checking unit configured to check a defective portion in a solder resist layer of a circuit board; a material filling unit positioned above the circuit board to fill the defective portion with a filling material; and a curing unit configured to cure the material filled in the defective portion. The defect checking unit may be configured to calculate a volume of the defective portion. The material filling unit may be configured to calculate a discharge amount of the filling material based on the calculated volume of the defective portion, and then configured to discharge the filling material by the discharge amount.

According to an aspect of the present disclosure, as a reprint method of a circuit board, the reprint method may include: checking a defective portion in a solder resist layer and calculating a volume of the defective portion; calculating a discharge amount calculating a discharge amount of a filling material based on the volume of the defective portion; and discharging the filling material to the defective portion in the calculated discharge amount.

According to an aspect of the present disclosure, a reprint apparatus, may include: a defect checking unit configured to check a defective portion in a solder resist layer; a material filling unit configured to fill the defective portion with a filling material until a depth or a volume of a remaining portion of the defective portion with respect to a surface of the solder resist layer is within a predetermined range after filling; and a curing unit configured to cure the material filled in the defective portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
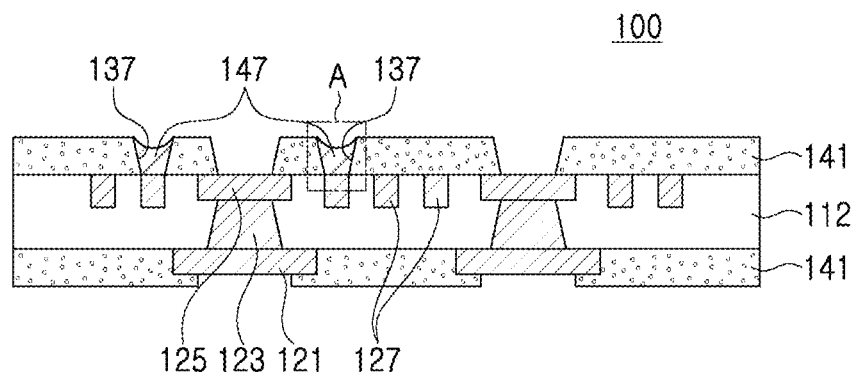
FIG. 1 is a cross-sectional view schematically illustrating a circuit board according to an embodiment of the present disclosure.

Hereinafter, exemplary embodiments of the present disclosure will be described in detail with reference to the accompanying drawings. Further, these embodiments are provided so that this disclosure will be thorough and complete, and will fully convey the scope of the disclosure to those skilled in the art. It should be understood that the various embodiments of the present disclosure are different, but need not be mutually exclusive. For example, certain features, structures, and characteristics described herein may be implemented in other exemplary embodiments without departing from the spirit and the scope of the present disclosure in connection with an exemplary embodiment. In addition, it is also to be understood that the position or disposition of individual components within each disclosed exemplary embodiment may be varied without departing from the spirit and the scope of the present disclosure. Therefore, the following detailed description is not to be taken in a limited meaning, and the scope of the present disclosure is to be limited only by the appended claims, along with the full scope of equivalents to which the claims are entitled, if properly explained. In the drawings, like reference numerals refer to the same or similar functions throughout the several aspects.

Hereinafter, exemplary embodiments of the present disclosure will be described in detail with reference to the accompanying drawings so that those skilled in the art may easily carry out the present disclosure.

In addition, unless otherwise specified in the following description, 'material' or 'filling material' refers to a material filled in a defective portion 137 to form the solder resist patch 147.

Figure 2:
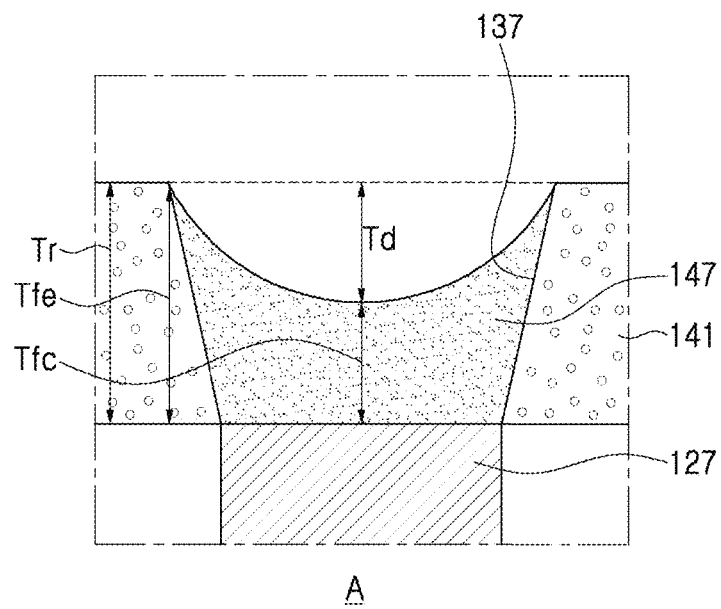
FIG. 2 is an enlarged view of part A of FIG. 1.

FIG. 1 is a cross-sectional view schematically illustrating a circuit board according to an embodiment of the present disclosure, and FIG. 2 is an enlarged view of part A of FIG. 1.

Referring to FIGS. 1 and 2, a circuit board 100 according to the present embodiment may include a printed circuit board (PCB), and include an insulating layer 112, pads 121 and 125, an interlayer via 123, a conductive layer 127, and a solder resist layer 141.

The number of layers of the insulating layer 112 and the number of the conductive layers 127 may be plural, respectively, and the plurality of insulating layers 112 and the plurality of conductive layers 127 may be alternately stacked. Accordingly, the insulating layer 112 may provide insulation between the plurality of conductive layers 127.

In addition, the insulating layer 112 may include a material different from that of the solder resist layer 141. For example, the insulating layer 112 may be a copper clad laminate (CCL), ABF, prepreg, FR-4, Bismaleimide Triazine (BT), or Photo Imagable Dielectric (PID) resin, and may be at least one selected from a group of resins of a thermosetting resin such as an epoxy resin, a thermoplastic resin such as polyimide, polytetrafluoroethylene (PTFE), glass-based and ceramic-based resins (e.g., low temperature co-fired ceramic (LTCC)).

The plurality of conductive layers 127 may include an interconnection forming an electrical connection path inside the circuit board 100, and a conductive plane may be disposed in a portion of the portion where the interconnection is not located.

The interlayer via 123 may connect between the plurality of conductive layers 127, and may be disposed to penetrate through at least one of the plurality of insulating layers 112.

A material included in the conductive layer 127 and the interlayer via 123 may be at least one of copper (Cu), silver (Ag), palladium (Pd), aluminum (Al), nickel (Ni), titanium (Ti), gold (Au), and platinum (Pt).

The pads 121 and 125 are a portion of the conductive layer 127, and solder for electrically connecting the circuit board 100 to an external surface may be bonded. Accordingly, at least a portion of the pads 121 and 125 may be formed to be exposed externally of a solder resist layer 141.

The solder resist layer 141 may be disposed on a surface formed by the insulating layer 112 or the conductive layer 127, and may be formed of an insulating material.

A defective portion 137 may be formed in the solder resist layer 141. In the present embodiment, the defective portion 137 may refer to a region in which a solder resist layer 141 is not formed in the process of forming the solder resist layer 141 differently from the intended design. Accordingly, the defective portion 137 may be formed in a shape of a groove such as a pin hole, and may mean a portion where the conductive layer 127 is exposed externally or is highly likely to be exposed externally later.

A solder resist patch 147 may be inserted into the defective portion 137. The solder resist patch 147 may be formed by being injected into the defective portion 137 through a reprint apparatus to be described later and then cured. Accordingly, the conductive layer 127 exposed to the defective portion 137 may be buried by the solder resist patch 147.

In this embodiment, a material contained in the solder resist layer 141 and a material contained in the solder resist patch 147 may be different from each other. Here, the different materials may include a case in which a content rate of inorganic fillers that may be contained in the solder resist is different from each other.

Accordingly, an interface between the solder resist patch 147 and the solder resist layer 141 may be identified by analysis using at least one of a micrometer, a transmission electron microscopy (TEM), an atomic force microscope (AFM), a scanning electron microscope (SEM), and a focused ion beam (FIB) optical microscope, and a surface profiler.

In addition, the interface between the solder resist patch 147 and the solder resist layer 141 may be identified by a difference in curing times between the solder resist layer 141 and the solder resist patch 147.

In addition, the solder resist patch 147 may be injected into the defective portion 137 in a liquid phase, and as illustrated in FIG. 2, the solder resist patch 147 may be formed in a concave shape due to surface tension during the curing process. Referring to FIG. 2, a thickness Tr of the solder resist layer 141 may be relatively constant, but a thickness Td of the solder resist patch 147 may decrease by a certain size toward a central portion thereof due to the concave shape. Accordingly, the solder resist patch 147 may be different from a central thickness Tfc and a maximum thickness Tfe, and thickness deviation of the solder resist patch 147 may be greater than thickness deviation of the solder resist layer 141.

In the present embodiment, a volume of the solder resist patch 147 disposed in the defective portion 137 may be smaller than a volume of an internal space formed by the defective portion 137. For example, the volume of the solder resist patch 147 may be formed in a range of 63 to 72% of the volume of the defective portion 137. This may be a range derived as the volume thereof is reduced while the material filled in the defective portion 137 is cured.

The solder resist layer 141 or the solder resist patch 147 may be formed of a material capable of photolithography, such as a photoresist. In addition, it can also be formed from a material that can be cured by UV.

Next, a reprint apparatus for forming the solder resist patch 147 in the defective portion 137 is described.

Figure 3:
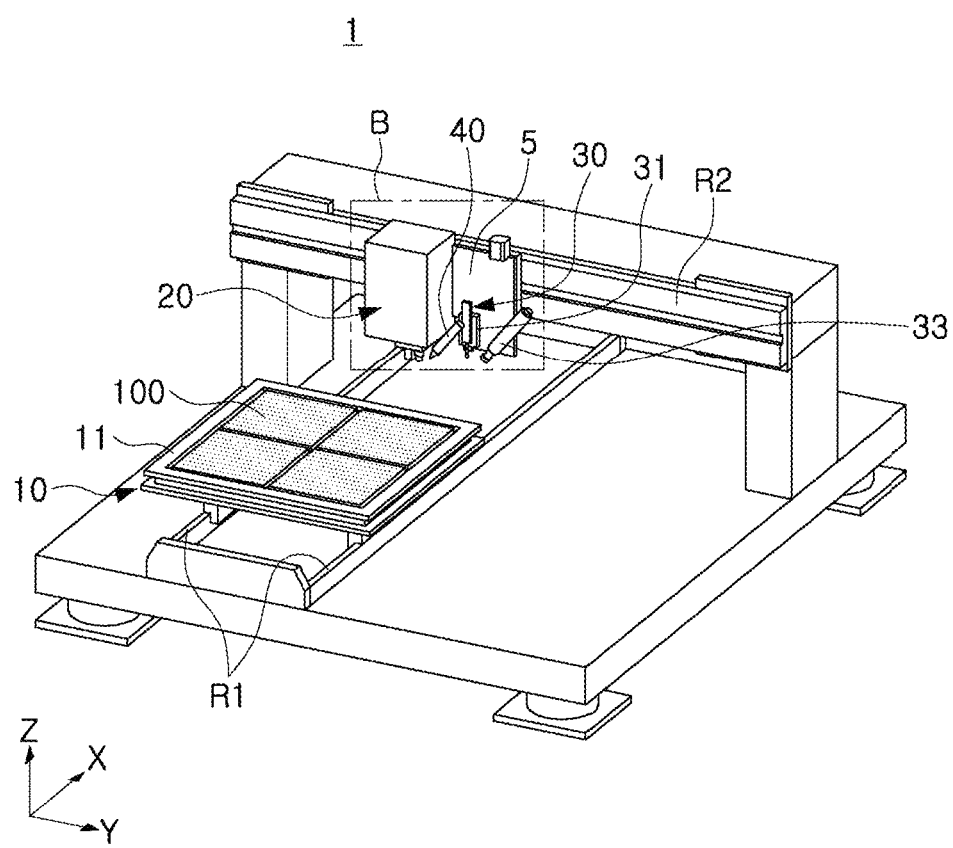
FIG. 3 is a perspective view schematically showing a reprint apparatus according to an embodiment of the present disclosure.
Figure 4:
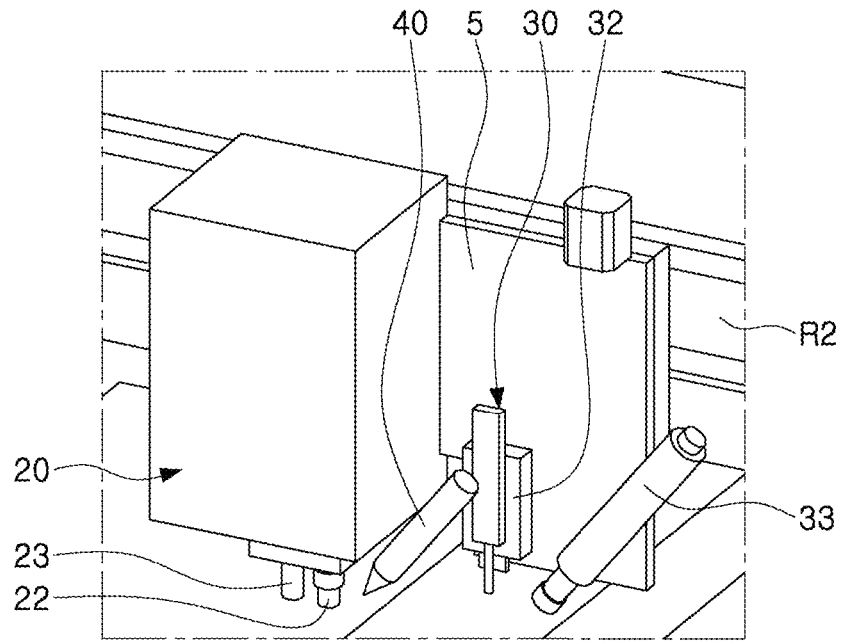
FIG. 4 is an enlarged view of part B of FIG. 3.
Figure 5:
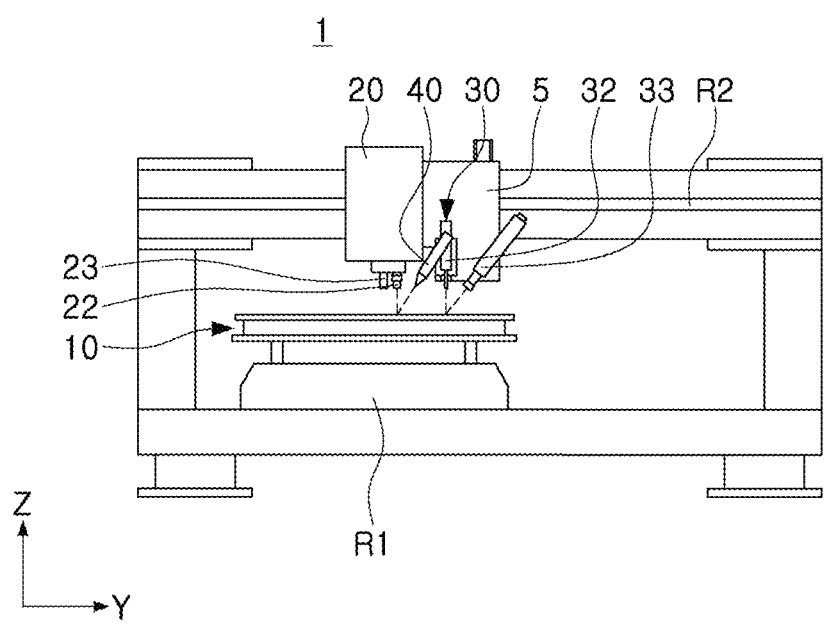
FIG. 5 is a side view of the reprint apparatus shown in FIG. 3.

FIG. 3 is a perspective view schematically illustrating a reprint apparatus according to an embodiment of the present disclosure, FIG. 4 is an enlarged view of part B of FIG. 3, and FIG. 5 is a side view of the reprint apparatus shown in FIG. 3.

Referring to FIGS. 3 to 5, a reprint apparatus 1 of the present embodiment may include a substrate seating unit 10, a defect checking unit 20, a material filling unit 30, and a curing unit 40.

A circuit board 100 in which coupling is found may be seated on the substrate mounting unit 10. To this end, the substrate seating unit 10 may include a support plate 11 on which the circuit board 100 is mounted. In addition, if necessary, at least one clamp (not shown) for fixing the circuit board 100 may be provided.

In the present embodiment, a plurality of clamps may be disposed along a circumferential surface of the support plate 11, and may suppress movement of the circuit board 100 by pressing the circuit board 100 toward the support plate from all directions. However, the present disclosure is not limited thereto, and various modifications are possible as long as the movement of the circuit board 100 can be suppressed.

The defect checking unit 20 may check defects by inspecting an upper surface of the circuit board 100. To this end, the defect checking unit 20 may be disposed to be movable from above the circuit board 100.

In this embodiment, the defect checking unit 20 can check a volume of the defective portion 137, described above or a filling amount of the solder resist patch 147, and to this end, may include a laser displacement sensor 22 and a first camera 23.

The laser displacement sensor 22 may be a 3D laser displacement sensor, and may obtain information on a shape or inclination degree of one surface of the circuit board 100 on which the solder resist layer 141 is formed. In this process, the laser displacement sensor 22 can check the defective portion 137 such as a pinhole. For example, the laser displacement sensor 22 may move on the circuit board 100 and, unlike the design, may recognize a region in which a distance from the circuit board 100 (thickness or depth of the solder resist of the substrate) rapidly changes as a defective portion 137.

Also, the defect checking unit 20 may calculate a volume of the defective portion 137 based on information obtained from the laser displacement sensor 22. Unlike this embodiment, when checking the defective portion 137 using only a camera such as a CCD, it is not easy to grasp the depth of the defective portion 137, and accordingly, it is not easy to calculate the volume of the defective portion 137. On the other hand, when the 3D laser displacement sensor 22 is used, since a change in the distance between the circuit board 100 and the 3D laser displacement sensor 22 can be continuously measured, the volume of the defective portion 137 can be easily calculated.

Also, the defect checking unit 20 may calculate a volume of the solder resist patch 147 formed in the defective portion 137 based on information obtained from the laser displacement sensor 22. For example, the defect checking unit 20 may calculate an initial volume of the defective portion 137 and a volume of the defective portion 137 after the material is filled, and compare the same to calculate a filling amount of the material injected into the defective portion 137.

Unlike this embodiment, when checking the filling amount of the material using only a camera such as a CCD, it is not easy to understand a thickness of the filled material (Tfc in FIG. 2) and a depth (Td in FIG. 2) of the remaining space, and accordingly, it is not easy to calculate the filling amount of the material.

On the other hand, when a 3D laser displacement sensor 22 is used as in the present embodiment, a change in the distance between the circuit board 100 and the laser displacement sensor 22 can be continuously measured, and since the depth of the defective portion 137 before and after the material is filled, may be measured, it is possible to easily calculate the amount of material filled in the defective portion 137. Therefore, quantitative filling is possible, and accordingly, it is possible to prevent a problem in which the material is excessively supplied during the filling process.

When the laser displacement sensor 22 operates, the first camera 23 may image the defective portion 137 located below the laser displacement sensor 22. Since the size of the defective portion 137 may vary, the defect checking unit 20 of the present embodiment may include both a low-magnification camera and a high-magnification camera.

In this embodiment, the defective portion 137 may be formed in various sizes to have a diameter of 10 μm to 300 μm. Therefore, the high-magnification camera may image the defective portion 137 having a minimum diameter of about 10 μm, and the low-magnification camera may image the defective portion 137 having a maximum diameter of about 300 μm.

A low-magnification camera and a high-magnification camera may be selectively used. For example, the camera of the present embodiment may be configured such that the low-magnification camera and the high-magnification camera are rotated and replaced in a rotary manner, and thus a camera suitable for imaging may be easily selected. However, the configuration of the present disclosure is not limited thereto, and it is also possible to configure the low-magnification camera and the high-magnification camera to be detachably configured to be replaced as necessary. In addition, if both high and low-magnification images can be captured using a single camera, it may be configured as a single camera.

In this embodiment, the laser displacement sensor 22 and the first camera 23 may be formed as one module, disposed to be spaced apart from each other by a predetermined distance. However, the present disclosure is not limited thereto, and it is possible to be formed as independent modules from each other, respectively, or may be integrated.

The material filling unit 30 may be positioned above the circuit board 100 to inject a material of the solder resist patch 147 into the defective portion 137.

For material injection, in this embodiment, the material filling unit 30 may discharge the material in an electro hydro dynamics (EHD) jet printing method, and accordingly, the material filling unit 30 may include a printer having an EHD nozzle 32.

The printer is not limited in a shape or position thereof as long as the material may be supplied to the EHD nozzle 32. In this embodiment, the printer can print in a manner that forms an electric field and discharges a material as if electrons are drawn from an electron gun. For example, instead of extracting electrons from a cathode, the material may be discharged or sprayed through the EHD nozzle 32.

To this end, the EHD nozzle 32 may be configured to be movable in a Z direction, which is a vertical direction, in order to adjust a distance from the circuit board 100. For example, the EHD nozzle 32 may be linearly reciprocated in the Z direction, and after being moved to a distance at which a material can be accurately inserted into the defective portion 137, the material may be discharged. In addition, the EHD nozzle 32 of the present embodiment may be configured to be linearly movable in X and Y directions as needed.

In addition, the EHD nozzle 32 of the present embodiment may be a hybrid nozzle to which voltage and pneumatic pressure are selectively/compositely applied. For example, when a diameter of the defective portion 137 is small (e.g., 10 μm), the material may be discharged using only voltage, and when the diameter of the defective portion 137 is large (e.g., 300 μm), the material may be discharged using pneumatic pressure for fast filling of the material. However, the configuration of the present disclosure is not limited thereto.

The material filling unit 30 may include a second camera 33 for imaging the circuit board 100 when the EHD nozzle 32 operates. The second camera 33 may image a process in which the material discharged from the printer 31 is injected into the defective portion 137. Therefore, like the first camera 23, the second camera 33 may include a low-magnification camera and a high-magnification camera, respectively, and if both high-magnification and low-magnification images can be captured using a single camera, the second camera 33 may be configured as a single camera.

In order to avoid interference with the EHD nozzle 32, the second camera 33 may be disposed to be inclined. For example, the second camera 33 may be disposed in a form of being inclined by 45 degrees to image the defective portion.

The curing unit 40 may harden a material of the solder resist injected into an inside of the defective portion 137. To this end, the curing unit 40 may include an irradiation device capable of irradiating UV to the defective portion 137. For example, the curing unit 40 may include a spot UV curing machine locally irradiating UV.

The material filling unit 30 and the curing unit 40 may be arranged to be movable from above the circuit board 100, similarly to the defect checking unit 20.

In the present embodiment, the substrate seating unit 10 is configured to be linearly moved in a first direction (e.g., X direction), and the printer 31, the defect checking unit 20, and the curing unit 40 is configured to be linearly moved in a second direction (e.g., Y direction). Here, the first direction and the second direction may be directions orthogonal to each other.

To this end, the substrate seating unit 10 may be coupled to be movable to a rail R1 disposed elongated in a first direction, and the material filling unit 30, the defect checking unit 20, and the curing unit 40 may be coupled to be movable to a rail R2 disposed elongated in a second direction at a position, higher than the substrate seating unit 10.

However, the configuration of the present disclosure is not limited thereto, and various modifications are possible as needed, such as the substrate seating unit 10 is configured to move in both first and the second directions, or the material filling unit 30, the defect checking unit 20, and the curing unit 40 are configured to move in both the first and second directions. In this regard, the substrate seating unit 10, and the material filling unit 30, the defect checking unit 20, and the curing unit 40 may move relatively, so that the circuit board 100 can be scanned by the defect checking unit 20 to identify pin holes, the pin holes identified by the defect checking unit 20 may be respectively filled with a suitable amount of a material for forming a solder resist patch by the material filling unit 30, and the filled material may be cured by the curing unit 40. It should be appreciated that motors may be used to control the movement of the substrate seating unit 10, and the movement of the material filling unit 30, the defect checking unit 20, and the curing unit 40.

In the present embodiment, the defect checking unit 20, the material filling unit 30, and the curing unit 40 may all be integrally coupled to a frame 5, and may all be configured to move together in the second direction above the circuit board 100. Therefore, when the defective portion 137 is identified in the defect checking unit 20, the material filling portion 30 moves to an upper portion of the defective portion 137 to fill the defective portion 137 with a material, and then the curing unit 40 may move to an upper portion of the defective portion 137 to cure the material. However, the configuration of the present disclosure is not limited thereto, and if necessary, it is also possible to configure the defect checking unit 20, the material filling unit 30, and the curing unit 40 to move independently of each other.

Next, a manufacturing method of the circuit board 100 using the reprint apparatus 1 of this embodiment is described.

Figure 6:
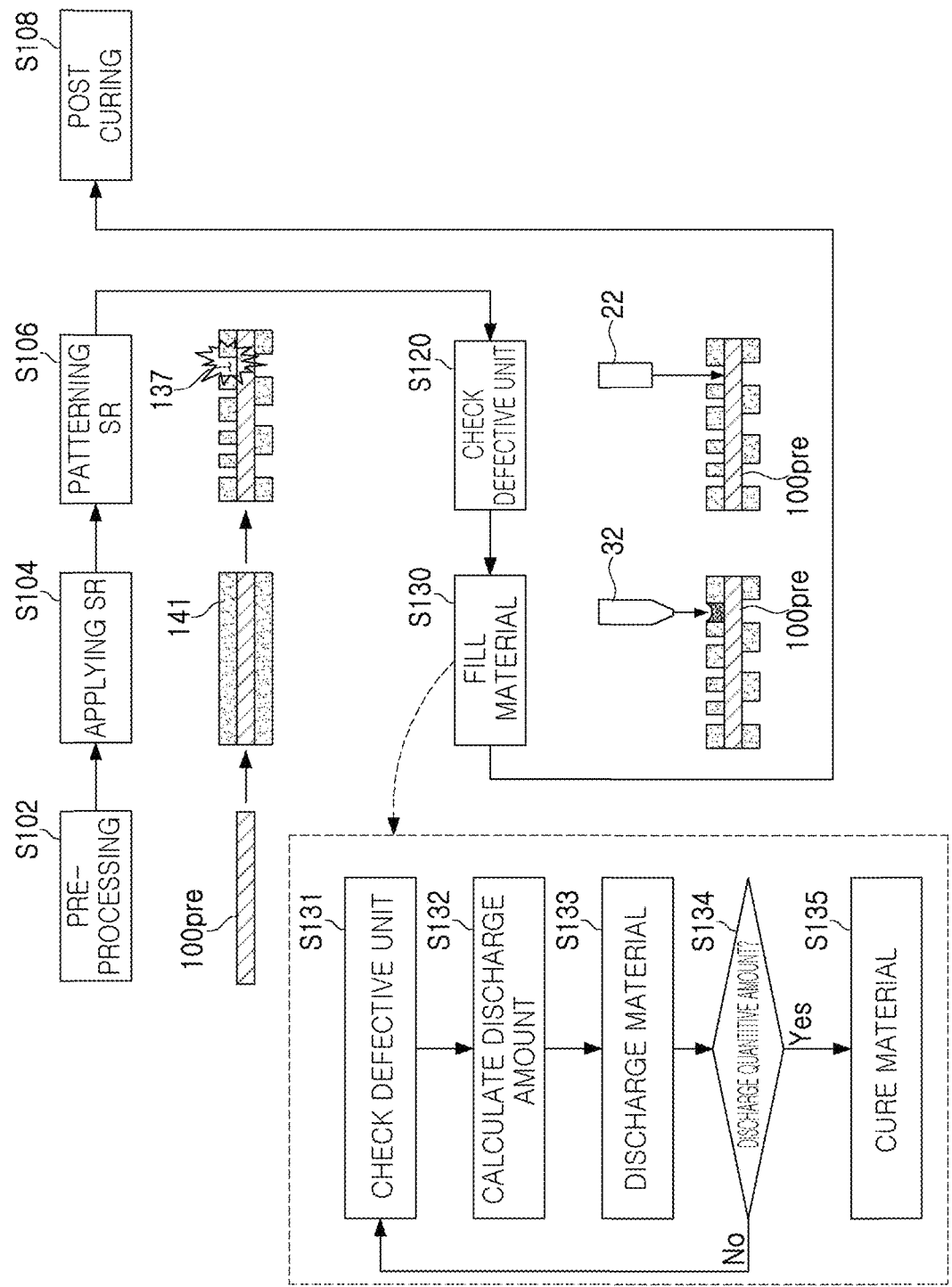
FIG. 6 is a view for illustrating a manufacturing method of a circuit board according to an embodiment of the present disclosure.

FIG. 6 is a view for illustrating a method of manufacturing a circuit board according to an embodiment of the present disclosure.

Referring to FIG. 6, the method of manufacturing a circuit board circuit board according to an embodiment of the present disclosure may include: an operation of pre-processing (e.g., washing with water) an unfinished substrate 100pre before applying a solder resist SR (S102), an operation of applying a solder resist layer 141 on a surface of the unfinished substrate 100pre (S104), an operation of patterning the solder resist layer 141 through a photolithography process (S106), and an operation of finally thermally curing the entire circuit board 100 (e.g., Post curing) (S108).

Meanwhile, the defective portion 137, described above may be generated in an operation of patterning the solder resist layer 141 (S106). Accordingly, the reprint method of the present embodiment may be performed after the operation of patterning of the resist layer 141 (S108), that is, immediately before an operation of thermally curing of the circuit board 100 (S135).

The reprint method of the circuit board 100 according to an embodiment of the present disclosure may include: an operation of checking a defective portion 137 in the circuit board 100 on which the solder resist layer 141 is patterned (S120), and an operation of filling the defective portion 137 with a solder resist material (S130).

The operation of checking the defective portion 137 of the circuit board 100 (S120) may be performed through a process of capturing an image through an image capturing apparatus such as a camera, and analyzing the captured image. Here, as the image capturing apparatus, a separate image capturing apparatus separated from the reprint apparatus 1 of the present embodiment may be used, but it is also possible to use the reprint apparatus 1 of the present embodiment if necessary.

Through image analysis, the image capturing apparatus may detect a region of a surface of the solder resist layer 141 that is separated from a surrounding region due to a pin hole or a foreign material. When a region expected to be the defective portion 137 is identified in the image capturing apparatus, coordinate information of the corresponding portion may be transmitted to the reprint apparatus 1.

Subsequently, an operation of filling the defective portion 137 with a material of a solder resist (S130) may be performed through the reprint apparatus 1.

The circuit board 100 on which the region expected to be the defective portion 137 is found is seated on the substrate seating unit 10 of the reprint apparatus 1, and the defect checking unit 20 may check a corresponding position by moving the laser displacement sensor 22 to the corresponding position according to the coordinate information transmitted from the image capturing apparatus.

The laser displacement sensor 22 may inspect one surface of the circuit board 100 at the corresponding position to recheck whether the corresponding region is a defective portion 137 (S131). In this embodiment, the defect checking unit 20 may define only a portion in which the conductive layer 127 is exposed as the defective portion 137, and a groove in which the conductive layer 127 is not exposed may not be defined as the defective portion 137. For example, if a depth of the groove is smaller than the thickness of the solder resist layer 141 or a preset reference, the defect checking unit 20 of the present embodiment may not define the corresponding groove as the defective portion 137. In addition, even when the corresponding region is formed by attachment of a foreign material rather than by a groove, the defect checking unit 20 may not be defined as the defective portion 137.

Subsequently, a volume of the defective portion 137 may be calculated, and a discharge amount of the material corresponding thereto may be calculated (S132).

First, the defect checking unit 20 may calculate a central position and size of the defective portion 137 through the laser displacement sensor 22. The position of the defective portion 137 may be calculated based on an approximate diameter of the defective portion 137, and the coordinates of a center of the corresponding diameter. In addition, since the laser displacement sensor 22 of the defect checking unit 20 may measure a distance from the circuit board 100 and a depth of the defective portion 137 (Tfe in FIG. 2), based thereon, a volume of the defective portion 137 may be calculated.

Subsequently, the material filling unit 30 may calculate an amount of material discharged to the defective portion 137 based on the volume of the defective portion 137.

As described above, when a material in a liquid state is injected into the defective portion 137, a thickness thereof may decrease toward a central portion due to surface tension. When the material is injected with 100% of the volume of the defective portion 137, there is a possibility that the material overflows externally of the defective portion. Therefore, in this embodiment, the discharge amount of the material is calculated to be 90% or less of the volume of the defective portion 137.

In addition, since the liquid material filled in the defective portion 137 is reduced by 20% to 30% of the volume while being cured, if the filled amount is too small, the thickness of the solder resist patch 147 is too thin, so that there may be a problem such as being easily peeled off or recognized as being defective. Accordingly, in this embodiment, the discharge amount of the material is calculated by 40% or more of the volume of the defective portion 137.

Therefore, in this embodiment, the material may be filled by 40% to 90% of the volume of the defective portion 137, and the amount of material discharged to the defective portion 137 may be calculated in a range of 40% to 90% of the volume of the defective portion 137. In this case, when the material is cured, the solder resist patch 147 may be formed by 28% to 72% of the volume of the defective portion 137.

Subsequently, an operation in which the material filling unit 30 discharges a solder resist material to the defective portion 137 (S133) may be performed. The material filling unit 30 may be moved by the printer 31 so that the EHD nozzle 32 is positioned above the defective portion 137. The material filling unit 30 may position the EHD nozzle 32 on a center of the defective portion 137 based on the position information of the defective portion 137 obtained by the defect checking unit 20.

Subsequently, the material filling unit 30 may move the EHD nozzle 32 to a position, suitable for discharging the material in a Z direction, and then discharging the material by an electro hydro dynamics (EHD) jet printing method. As described above, the material filling unit 30 may discharge a material in the discharge amount calculated in the operation S132, and thus the material may be filled in a range of 40% to 90% of the volume of the defective portion 137.

The discharge amount of the material may be controlled through an electric field (E-field) or voltage applied around the EHD nozzle 32.

When the discharging of the material is completed, an operation of checking whether the material is discharged in a quantitative amount (e.g., the discharge amount calculated in the operation S132) (S134) may be performed.

The present operation may be an operation of rechecking the volume of the defective portion 137 to calculate the amount of material filled in the defective portion 137, and checking whether the calculated amount of the material corresponds to the pre-calculated discharge amount.

To this end, the defect checking unit 20 may move to an upper portion of the defective portion 137 again to determine the filling amount of the material and whether the material is normally discharged. In this process, the defect checking unit 20 may determine a thickness Td of the filled material, and based on this, check and calculate an amount of the material filled in the defective portion 137. For example, when a depth Td of the material measured in this operation exceeds 60% of an initial depth measured in the operation S131, it can be inferred that an actual discharge amount is smaller than the pre-calculated discharge amount, so the defect checking unit 20 may determine that the material is not smoothly discharged in the operation S133.

Therefore, if the calculated amount of material is smaller than the pre-calculated of discharge amount, the above-described operations S132 and S133 may be re-performed, until the depth Td of the defective portion 137 after filing filling or the volume of the defective portion 137 after filling is within a predetermined range. For example, a discharge amount may be recalculated based on the depth Td of the defective portion 137 in which the material is partially filled, and the material may be additionally injected into the defective portion 137 with the recalculated discharge amount.

Meanwhile, when the depth Td of the defective portion 137 measured in the operation S134 is 60% or less of the initial depth, the reprint apparatus 1 may recognize that the defective portion 137 is filled with a quantitative material, and may perform an operation of curing the solder resist material filled in the defective portion 137 (S135).

The present operation may be an operation of curing only the solder resist material filled in the defective portion 137 by irradiating UV locally through a curing unit 40.

Meanwhile, when the liquid solder resist material filled in the defective portion 137 is cured, the material may be reduced to 70% to 80% of the initial volume of the liquid phase.

Therefore, as described above, when the liquid material is filled to 40% of the volume of the defective portion 137, when the material is cured, the solder resist patch 147 may be formed in a volume of 28% to 32% of the volume of the defective portion 137, and when the liquid material is filled to 90% of the volume of the defective portion 137, when the material is cured, the solder resist patch 147 may be formed in a volume of 63% to 72% of the volume of the defective portion 137. Accordingly, the volume of the cured solder resist patch 147 may be formed in a range of 28% to 72% of the volume of the defective portion 137.

Since the circuit board reprint apparatus and the reprint method according to the present embodiment configured as described above can be used by repairing the defective circuit board 100 without discarding the same, the manufacturing cost can be reduced.

In addition, since the laser displacement sensor 22 and the EHD nozzle 32 are used, more precise reprinting may be performed. Unlike the present embodiment, when the defective portion 137 is identified using only a camera, it is difficult to determine the depth or volume of the defective portion 137 in detail. Therefore, it is difficult to calculate the amount of material injected into the defective portion 137, and the process of injecting the material thereto may be complicated.

However, since the reprint apparatus 1 and the reprint method according to the present embodiment check the position and volume of the defective portion 137 using the laser displacement sensor 22, the position of the defective portion 137 may be more clearly identified, and the material may be discharged in an appropriate amount corresponding to the size of the defective portion 137. Therefore, it is possible to prevent problems such as overflowing the material externally of the defective portion 137, discharging the material to a wrong location, or the like.

Meanwhile, the present disclosure is not limited to the above-described embodiment and various modifications may be made.

Figure 7:
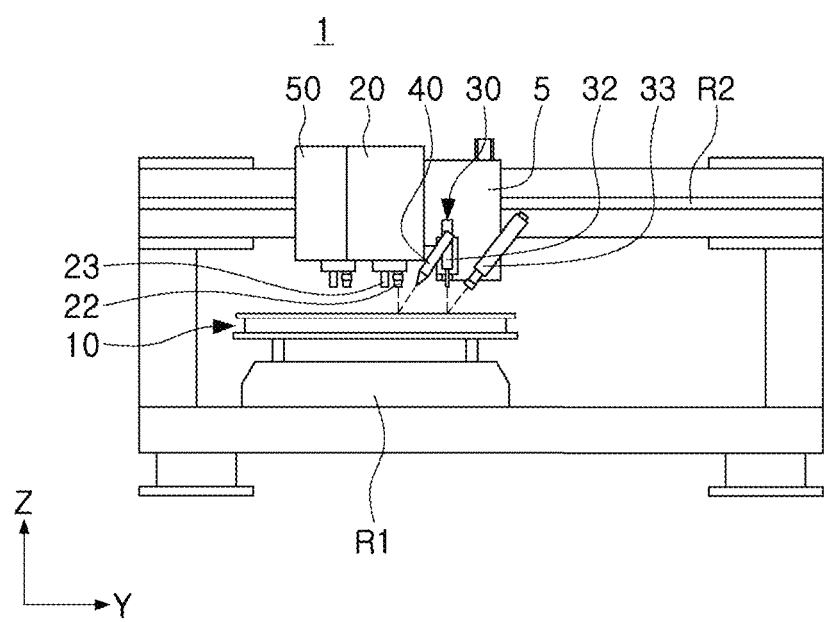
FIG. 7 is a side view of a reprint apparatus according to another embodiment of the present disclosure.

FIG. 7 is a side view of a reprint apparatus according to another embodiment of the present disclosure.

Referring to FIG. 7, a reprint apparatus 2 of the present embodiment is configured similarly to the above-described embodiment, and further includes a filling checking unit 50.

The defect checking unit 20 of the present embodiment may check a defective portion 137 and calculate a volume of the defective portion 137. The filling checking unit 50 may calculate a volume of a material filled in the defective portion 137.

Accordingly, the filling checking unit 50 may include a laser displacement sensor 52, similarly to the defect checking unit 20, and may be coupled to a frame 5, like the defect checking unit 20. Accordingly, the filling checking unit 50 may be configured to move in a second direction, together with a defect checking unit 20, a material filling unit 30, and a hardening unit 40 in an upper portion of the circuit board 100. However, the configuration of the present disclosure is not limited thereto, and it is also possible to configure the filling checking unit 50 and the defect checking unit 20 to move independently of each other.

The filling checking unit 50 may calculate the volume of the material injected into the defect part 137 based on the information obtained from a laser displacement sensor 52. For example, the filling checking unit 50 may calculate and compare an initial volume of the defective portion 137 with a volume of the defective portion 137 after the material is filled, to calculate a filling amount of the material injected into the defective portion 137.

When the calculated filling amount is smaller than the previously calculated discharge amount, a reprint apparatus 2 may re-perform operations S132 and S133 described above.

In addition, the filling checking unit 50 may include a third camera 53 configured similarly to the first camera 23 of the defect checking unit 20. The third camera 53 may image a defective portion 137 located below the laser displacement sensor 52 when the laser displacement sensor 52 is operating. Since a size of the defective portion 137 may vary, the third camera 53 may include both a low-magnification camera and a high-magnification camera.

The reprint apparatus 2 of this embodiment configured as described above includes both the defect checking unit 20 and the filling checking unit 50. Therefore, the defect checking unit 20 may be used in the operation S131 of checking the defective portion 137, and the filling checking unit 50 may be used in the operation S134 of checking the filling amount of the material filled in the defective portion 137.

Figure 8:
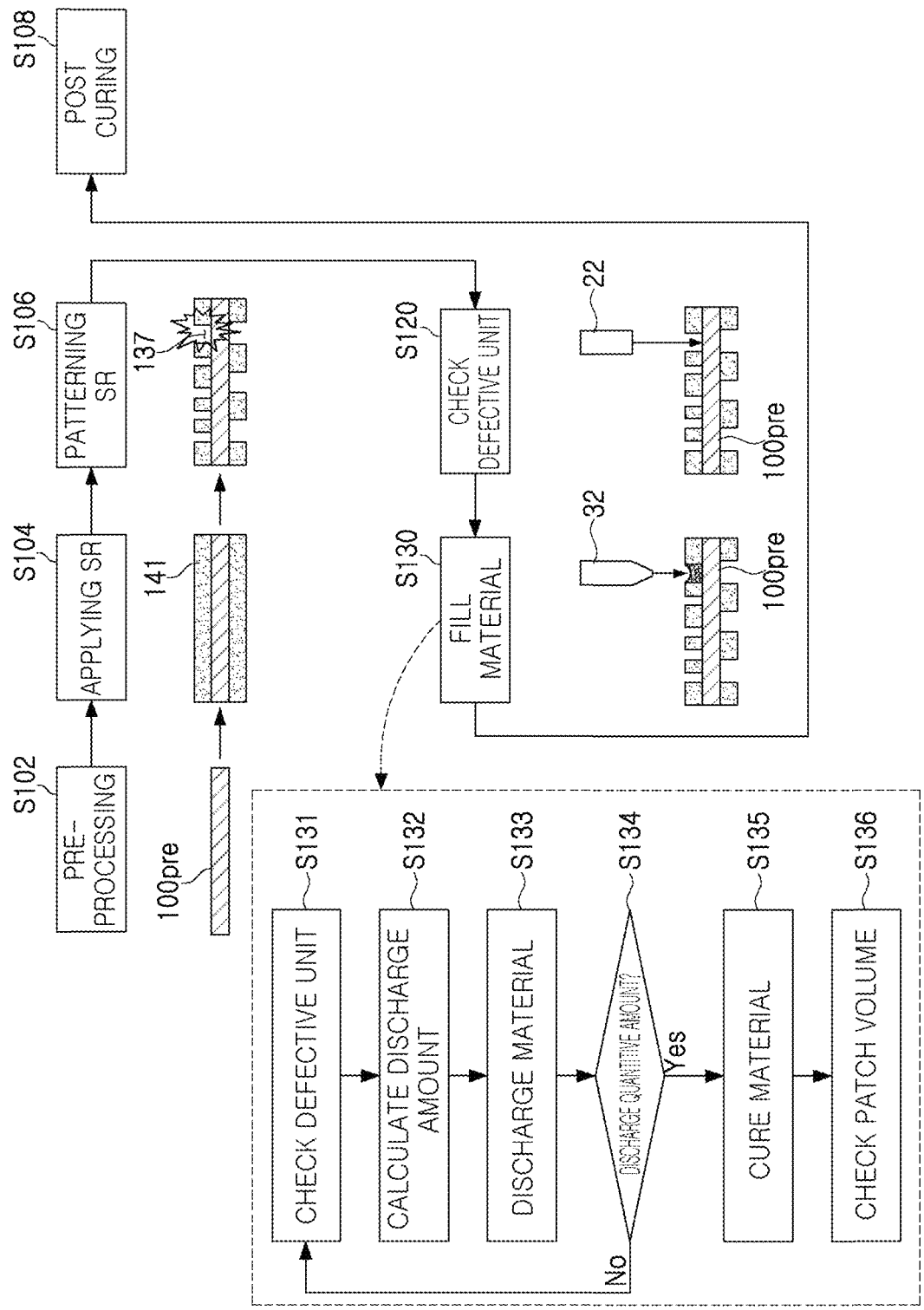
FIG. 8 is a view for explaining a manufacturing method of a circuit board according to another embodiment of the present disclosure.

FIG. 8 is a view for illustrating a method of manufacturing a circuit board according to another embodiment of the disclosure.

Referring to FIG. 8, the circuit board manufacturing method of the present embodiment is configured similarly to the above-described embodiment of FIG. 6, and further includes an operation of checking a patch volume (S136).

The operation of checking the patch volume (3136) may be performed after the operation of curing a material of the solder resist filled in the defective portion 137 (S135) described in the above-described embodiment, and may be performed through the defect checking unit 20 or the filling checking unit 50.

As described above, when the material of the solder resist in a liquid phase is cured, it may be reduced to 70% to 80% of the initial volume of the liquid phase. Accordingly, when the volume of the material of the solder resist in a liquid phase is excessively reduced while the material of the solder resist in a liquid phase is cured, the volume of the solder resist patch 147 described above may be formed to be 28% or less of the volume of the defective portion 137.

Accordingly, in a reprint method of this embodiment, after curing the material filled in the defective portion 137, an operation of checking the volume of the additionally cured solder resist patch 147 may be performed.

When the volume or thickness of the material hardened in this step, that is, the solder resist patch 147, is 28% or less compared to the volume or depth of the defective portion 137 before filling the material, the reprint apparatus recognizes that the discharge amount is insufficient, so that the above-described step S132 and Step S133 may be re-performed. In the present operation, the defect checking unit 20 or the filling checking unit 50 may re-calculate the discharge amount based on the depth Td of the defective portion 137 in which the solder resist patch 147 is formed, and the material filling unit 30 may additionally inject a material into the defective portion 137 with the re-calculated discharge amount.

Meanwhile, in the reprint method according to this embodiment, an operation of checking whether the material is discharged in a quantitative amount (S134) before the operation of curing the solder resist material filled in the defective portion 137 (S135) is performed. However, since the patch volume is checked even after the material is cured, the operation S134 may be omitted in some cases.

As set forth above, according to an embodiment of the present disclosure, a position and a volume of a defective portion are checked using a laser displacement sensor, so that the position and volume of the defective portion can be more clearly identified, and a material thereof may be discharged in an appropriate amount corresponding to the size of the defective portion. Therefore, it is possible to prevent problems such as overflowing of the material externally of the defective portion or discharging the material to a wrong location.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

While exemplary embodiments have been shown and described above, it will be apparent to those skilled in the art that modifications and variations could be made without departing from the scope of the present invention as defined by the appended claims.

What is claimed is:

1. A reprint apparatus, comprising:
   a defect checking unit configured to check a defective portion in a solder resist layer of a circuit board;
   a material filling unit positioned above the circuit board to fill the defective portion with a filling material; and
   a curing unit configured to cure the material filled in the defective portion,
   wherein the defect checking unit is configured to calculate a volume of the defective portion,
   wherein the material filling unit is configured to calculate a discharge amount of the filling material based on the calculated volume of the defective portion, and then discharge the filling material by the discharge amount,
   wherein the defect checking unit, the material filling unit, and the curing unit are integrally formed and are configured to move together from above the circuit board.

2. The reprint apparatus of claim 1, wherein the material filling unit is configured to calculate the discharge amount in a range of 40% to 90% of the volume of the defective portion.

3. The reprint apparatus of claim 1, wherein the defective checking unit comprises a laser displacement sensor for measuring the volume of the defective portion.

4. The reprint apparatus of claim 3, wherein the defective checking unit comprises a first camera for imaging the circuit board when the laser displacement sensor operates.

5. The reprint apparatus of claim 3, wherein the laser displacement sensor is configured to calculate a central position of the defective portion, and the material filling unit is configured to discharge the filling material at the central position.

6. The reprint apparatus of claim 1, wherein the material filling unit comprises an electro hydro dynamics (EHD) nozzle for discharging the filling material by an EHD jet printing method.

7. The reprint apparatus of claim 6, wherein the material filling unit comprises a second camera for imaging the circuit board when the EHD nozzle operates.

8. The reprint apparatus of claim 6, wherein the EHD nozzle linearly reciprocates in a vertical direction.

9. The reprint apparatus of claim 1, wherein the curing unit comprises a spot UV curing machine, and is configured to locally irradiate UV to the defective portion.

10. The reprint apparatus of claim 1, further comprising:
    a substrate seating unit on which the circuit board is mounted,
    wherein the substrate seating unit is linearly moved in a first direction, and the defect checking unit, the material filling unit, and the curing unit are linearly moved in a second direction,
    the first direction and the second direction being orthogonal to each other.

11. The reprint apparatus of claim 1, wherein, after the filling material is filled in the defective portion, the defect checking unit checks a filling amount of the filling material discharged to the defective portion.

12. The reprint apparatus of claim 1, further comprising:
    a filling checking unit configured to check the filling amount of the filling material discharged to the defective portion, after the filling material is filled in the defective portion.

13. A reprint apparatus, comprising:
    a defect checking unit configured to check a defective portion in a solder resist layer;
    a material filling unit configured to fill the defective portion with a filling material until a depth or a volume of a remaining portion of the defective portion with respect to a surface of the solder resist layer is within a predetermined range after filling; and
    a curing unit configured to cure the material filled in the defective portion,
    wherein the defect checking unit, the material filling unit, and the curing unit are integrally formed and are configured to move together from above the circuit board.

14. The reprint apparatus of claim 13, wherein the defective checking unit comprises a laser displacement sensor for measuring the defective portion.

15. The reprint apparatus of claim 14, wherein the defective checking unit further comprises a camera for imaging the solder resist layer.

16. The reprint apparatus of claim 14, wherein the laser displacement sensor is configured to calculate a central position of the defective portion, and the material filling unit is configured to discharge the filling material at the central position.

17. The reprint apparatus of claim 13, wherein the defect checking unit is configured to determine the depth or the volume of the remaining portion of the defective portion with respect to the surface of the solder resist layer after filling.

18. The reprint apparatus of claim 13, further comprising a filling checking unit configured to determine the depth or the volume of the remaining portion of the defective portion with respect to the surface of the solder resist layer after filling.

* * * * *